United States Patent
Li et al.

(10) Patent No.: US 11,730,045 B2
(45) Date of Patent: Aug. 15, 2023

(54) SINTERING APPARATUS, PACKAGING SYSTEM FOR ORGANIC LIGHT EMITTING DIODE DEVICE AND SINTERING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Bing Li, Beijing (CN); Ang Xiao, Beijing (CN); Fuyi Cui, Beijing (CN); Jingjing Chen, Beijing (CN); Xueyong Zhang, Beijing (CN); Dan Jia, Beijing (CN); Lina Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 201 days.

(21) Appl. No.: 15/538,261

(22) PCT Filed: Sep. 27, 2016

(86) PCT No.: PCT/CN2016/100312
§ 371 (c)(1),
(2) Date: Jun. 21, 2017

(87) PCT Pub. No.: WO2017/181593
PCT Pub. Date: Oct. 26, 2017

(65) Prior Publication Data
US 2018/0212206 A1    Jul. 26, 2018

(30) Foreign Application Priority Data
Apr. 19, 2016  (CN) .................. 2016 2 0331113 U

(51) Int. Cl.
*F27B 9/02* (2006.01)
*F27B 13/02* (2006.01)
(Continued)

(52) U.S. Cl.
CPC .............. *H01L 51/56* (2013.01); *H01J 9/261* (2013.01); *H01L 27/3241* (2013.01); *H01L 51/524* (2013.01)

(58) Field of Classification Search
CPC .......... F27B 9/028; F27B 9/029; F27B 13/02; F27B 9/02; F27B 9/24; F27B 9/262; F27B 5/02; F27B 9/10
See application file for complete search history.

(56) References Cited

U.S. PATENT DOCUMENTS 2,960,744 A  *  11/1960  Blank .................... C04B 35/26
                                                              252/62.53
3,708,157 A  *   1/1973  Aubry .................... F27B 9/045
                                                                432/66
(Continued)

FOREIGN PATENT DOCUMENTS

CN          1432184 A       7/2003
CN          1516990 A       7/2004
(Continued)

OTHER PUBLICATIONS

International search report dated Jan. 12, 2017 for corresponding application PCT/CN2016/100312 with English translation attached.
(Continued)

*Primary Examiner* — Gregory A Wilson
(74) *Attorney, Agent, or Firm* — Nath, Goldberg & Meyer; Joshua B. Goldberg

(57) ABSTRACT

The application provides a sintering apparatus, a packaging system for an organic light emitting diode device and a sintering method, belongs to the technical field of organic
(Continued)

light emitting diode device and can solve problems of long process time and high cost existed in the existing high temperature sintering process of organic light emitting diode device. The sintering apparatus comprises two sintering chambers capable of being communicated with each other, during operation, the substrate coated with glass cement is first placed into a sealed first sintering chamber to complete a first sintering process; then the substrate is placed into the second sintering chamber to complete a second sintering process. Thus, a time interval between the first sintering process and the second sintering process can be reduced, and no more nitrogen is wasted in transition from the first sintering process to the second sintering process.

20 Claims, 4 Drawing Sheets

(51) Int. Cl.
  *H01L 51/56* (2006.01)
  *H01J 9/26* (2006.01)
  *H01L 27/32* (2006.01)
  *H01L 51/52* (2006.01)

(56) References Cited

U.S. PATENT DOCUMENTS

| | | | | |
|---|---|---|---|---|
| 3,790,336 | A * | 2/1974 | Brede, III | B22F 3/003 432/163 |
| 3,982,888 | A * | 9/1976 | Moussou | F27B 9/023 432/128 |
| 4,047,886 | A * | 9/1977 | Heyraud | B22F 3/003 432/128 |
| 6,530,780 | B2 * | 3/2003 | Mori | F27B 9/028 432/121 |
| 7,070,471 | B2 * | 7/2006 | Shiokawa | H01J 9/02 445/24 |
| 8,328,551 | B2 * | 12/2012 | Orbeck | B23K 1/008 432/59 |
| 2008/0116621 | A1 * | 5/2008 | Brennan | F27B 9/10 264/606 |
| 2016/0368828 | A1 * | 12/2016 | Weiand | C04B 35/64 |

FOREIGN PATENT DOCUMENTS

| | | |
|---|---|---|
| CN | 101454860 A | 6/2009 |
| CN | 205542906 U | 8/2016 |
| EP | 1276129 A1 | 1/2003 |
| JP | 2005319371 A | 11/2005 |

OTHER PUBLICATIONS

European Search Report dated Dec. 16, 2019, for corresponding Chinese application 16874084.3.

* cited by examiner

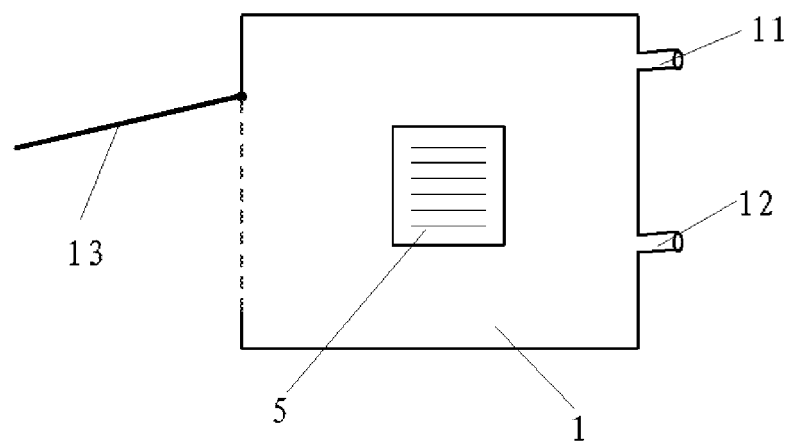
Fig. 1 -Prior Art-
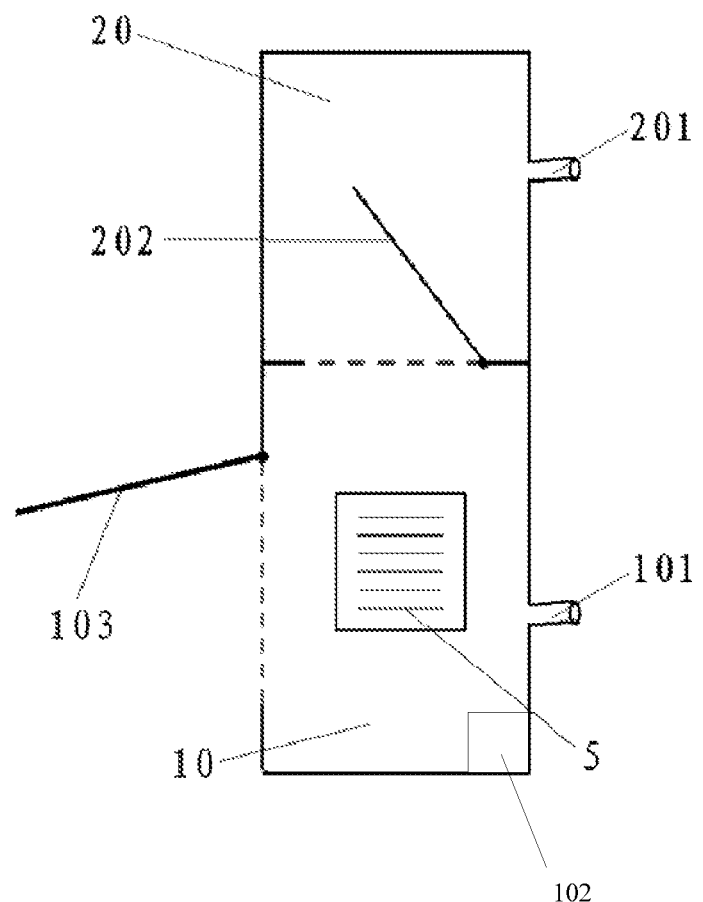
Fig. 2

SINTERING APPARATUS, PACKAGING SYSTEM FOR ORGANIC LIGHT EMITTING DIODE DEVICE AND SINTERING METHOD

This is a National Phase Application filed under 35 U.S.C. 371 as a national stage of PCT/CN2016/100312, filed Sep. 27, 2016, an application claiming the benefit of Chinese Application No. 201620331113.4, filed Apr. 19, 2016, the content of each of which is hereby incorporated by reference in its entirety.

TECHNICAL FIELD

The present application relates to the technical field of an organic light emitting diode, and particularly to a sintering apparatus, a packaging system for an organic light emitting diode device and a sintering method.

BACKGROUND ART

Organic light emitting diode (OLED) devices are self-luminous display devices using a current to drive light-emitting materials to emit light. Common light-emitting materials used in OLED devices include small molecule dyes and pigments. These small molecule dyes and pigments are very sensitive to water and oxygen and will lose their light-emitting properties soon when they are exposed to water and oxygen. Therefore, a good package is critical to the service life of the OLED device. Existing packaging technologies include glass cement packaging, film packaging and drip packaging and the like. In the glass cement packaging in which processes and materials have been matured, it is required to perform a high temperature sintering process on the glass cement coated on the glass substrate to remove organic solvent and additives in the glass cement so as to improve the reliability of the glass cement packaging.

The high temperature sintering process of the glass cement usually comprises two steps: a first step is to bake a substrate coated with the glass cement in an air atmosphere; and a second step is to treat it in a nitrogen atmosphere.

The inventor has discovered that there are at least the following problems in the existing technology: an existing high temperature sintering apparatus shown in FIG. 1 comprises a sintering chamber 1, the sintering chamber 1 is provided with a chamber door 13, the sintering chamber 1 is further provided with an air ventilation pipe 11 communicating with external air and a nitrogen ventilation pipe 12 for charging nitrogen into the sintering chamber 1. After the first step of the above process is performed on a substrate 5 coated with the glass cement, a large amount of nitrogen must be continuously charged into the sintering chamber 1 till contents of oxygen and water in the sintering chamber 1 are reduced to be less than 100 ppm, then the second step of the above process is performed. This procedure takes a long time (about 60 min) and consumes a large amount of nitrogen, thus the cost is high.

SUMMARY

In view of the problems of long process time and high cost existed in the existing high temperature sintering process, the present application provides a sintering apparatus, a packaging system for an organic light emitting diode device and a sintering method.

A technical solution adopted in the present application to solve the above problems is a sintering apparatus, which is used for sintering a substrate coated with glass cement, and comprises a first sintering chamber and a second sintering chamber which are disposed adjacent to each other, wherein, the first sintering chamber is provided with a first chamber door capable of being opened or closed, and a first ventilation pipe communicating with external air, the substrate is placed into the first sintering chamber or taken out from the first chamber through the first chamber door;

the second sintering chamber is provided with a second ventilation pipe for introducing a second gas into the second sintering chamber; and the first sintering chamber and the second sintering chamber are capable of being communicated with each other.

Optionally, the first sintering chamber is further provided with a blower device.

Optionally, a second chamber door capable of being opened or closed is provided between the first sintering chamber and the second sintering chamber.

Optionally, the second chamber door comprises a hard sealed heat insulation plate.

Optionally, a third ventilation pipe for introducing the second gas is provided at a position of the second sintering chamber close to the second chamber door.

Optionally, the sintering apparatus further comprises a transporting device for transporting the substrate between the first sintering chamber and the second sintering chamber.

Optionally, the transporting device is an elevating stage, and the second sintering chamber is provided above the first sintering chamber.

Optionally, the transporting device is an elevating stage, and the second sintering chamber is provided below the first sintering chamber.

Optionally, the transporting device is a transmission slide rail, and the first sintering chamber and the second sintering chamber are provided side by side.

Optionally, the sintering apparatus further comprises a transporting chamber, a third chamber door capable of being opened or closed is provided between the transporting chamber and the first sintering chamber, and a fourth chamber door capable of being opened or closed is provided between the transporting chamber and the second sintering chamber.

Optionally, the second gas is an inert gas.

Optionally, the inert gas is nitrogen.

The present application further provides a packaging system for an organic light emitting diode device, which comprises the above sintering apparatus.

The present application further provides a sintering method implemented by using the sintering apparatus described above, the sintering method comprises steps of:

placing a substrate into the first sintering chamber;

performing a first sintering process on the substrate in the first sintering chamber;

upon completion of the first sintering process, opening the second chamber door between the first sintering chamber and the second sintering chamber, and placing the substrate into the second sintering chamber; and closing the second chamber door, and performing a second sintering process on the substrate in the second sintering chamber.

Optionally, the sintering apparatus further comprises a transporting chamber, and the sintering method further comprises steps of:

after the first sintering process is performed on the substrate in the first sintering chamber, opening a third chamber door between the first sintering chamber and the transporting chamber, and transporting the substrate into the transporting chamber; and closing the third chamber door and opening a fourth chamber door between the transporting chamber and the second sintering chamber, and transporting the substrate into the second sintering chamber.

Optionally, the sintering apparatus further comprises a transporting chamber, and the sintering method further comprises steps of:

after the second sintering process is performed on the substrate in the second sintering chamber, opening a fourth chamber door between the second sintering chamber and the transporting chamber, and transporting the substrate into the transporting chamber; and closing the fourth chamber door and opening a third chamber door between the transporting chamber and the first sintering chamber, and transporting the substrate into the first sintering chamber.

The sintering apparatus of the present application has two sintering chambers capable of being communicated with each other, and each of the two sintering chambers is provided with a ventilation pipe for access of a gas (for example, air or nitrogen), therefore, the two sintering chambers may be in different atmospheres. During operation, a substrate coated with glass cement is first placed into a sealed first sintering chamber to complete a first sintering process; then the substrate is placed into the second sintering chamber to complete a second sintering process. Compared with the prior art, a time interval between the first sintering process and the second sintering process can be reduced, and no more second gas is wasted in transition from the first sintering process to the second sintering process. The sintering apparatus of the present application is applicable to a sintering process of a display device.

BRIEF DESCRIPTION OF THE DRAWINGS

FIG. 1 is a structural diagram of a sintering apparatus in the prior art;

FIG. 2 is a structural diagram of a sintering apparatus in an embodiment of the present application;

Figure 3:
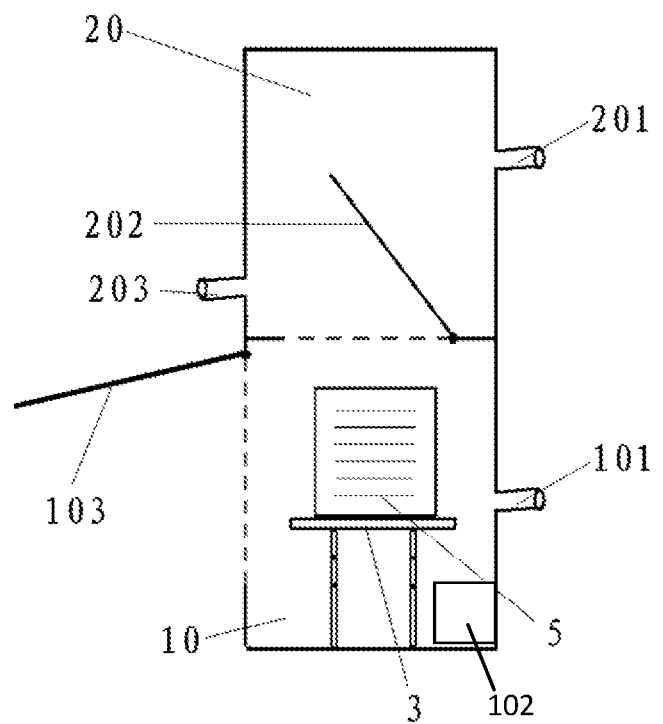
FIG. 3 is a structural diagram of a sintering apparatus in an embodiment of the present application.

Reference numerals: 1—sintering chamber; 11—air ventilation pipe; 12—nitrogen ventilation pipe; 13—chamber door; 10—first sintering chamber; 101—first ventilation pipe; 102—blower device; 103—first chamber door; 20—second sintering chamber; 201—second ventilation pipe; 202—second chamber door; 203—third ventilation pipe; 3—transporting device; 4—transporting chamber; 401—third chamber door; 402—fourth chamber door; 5—substrate.

DETAILED DESCRIPTION OF THE EMBODIMENTS

In order to make a person skilled in the art better understand solutions of the present application, the present application will be further described in detail in conjunction with accompanying drawings and embodiments.

First Embodiment

This embodiment provides a sintering apparatus, which is used for sintering a substrate 5 coated with glass cement thereon, as shown in FIG. 2, and comprises a first sintering chamber 10 and a second sintering chamber 20 disposed adjacent to each other, wherein the first sintering chamber 10 is provided with a first chamber door 103 capable of being opened or closed, and a first ventilation pipe 101 communicating with external air, the substrate 5 may be placed into the first sintering chamber 10 through the first chamber door 103;

the second sintering chamber 20 is provided with a second ventilation pipe 201 for introducing a second gas into the second sintering chamber 20; and the first sintering chamber 10 and the second sintering chamber 20 may be communicated with each other.

The sintering apparatus of the present embodiment has two sintering chambers capable of being communicated with each other, during operation, the substrate 5 coated with glass cement is first placed into a sealed first sintering chamber 10 to complete a first sintering process; then the substrate 5 is placed into the second sintering chamber 20 to complete a second sintering process. Compared with the prior art, a time interval between the first sintering process and the second sintering process can be reduced, and no more second gas is wasted in transition from the first sintering process to the second sintering process. The sintering apparatus of the present embodiment is applicable to a sintering process of a display device.

Second Embodiment

This embodiment provides a sintering apparatus, which is used for sintering a substrate 5 coated with glass cement thereon, as shown in FIGS. 2-6, and comprises a first sintering chamber 10 and a second sintering chamber 20 disposed adjacent to each other, wherein the first sintering chamber 10 is provided with a first chamber door 103 capable of being opened or closed, and a first ventilation pipe 101 communicating with external air, the substrate 5 may be placed into the first sintering chamber 10 through the first chamber door 103;

the second sintering chamber 20 is provided with a second ventilation pipe 201 for introducing a second gas into the second sintering chamber 20; and a second chamber door 202 capable of being opened or closed, is provided between the first sintering chamber 10 and the second sintering chamber 20.

The second gas refers to an inert gas generally used in a sintering process, and in this embodiment, nitrogen is taken as an example to illustrate. Specifically, in order to increase productivity, a plurality of substrates 5 coated with glass cement thereon are placed on a clamp and then the clamp is first delivered into the first sintering chamber 10 by a mechanical hand.

The sintering apparatus of this embodiment has two sintering chambers, that is, the first sintering chamber 10 and the second sintering chamber 20, between which a second chamber door 202 capable of being opened or closed, is provided. During operation, first, the substrate 5 coated with glass cement is placed into the first sintering chamber 10 through the first chamber door 103, then a first sintering process is completed for the substrate 5 in sealed first sintering chamber 10; next, the second chamber door 202 is opened, the substrate 5 is placed into the second sintering chamber 20 and the second chamber door 202 is closed, and a second sintering process is completed for the substrate 5 in sealed second sintering chamber 20. Specifically, a sintering time of the first sintering process is 20-40 min, a temperature of the first sintering process is at 300-350° C., a sintering time of the second sintering process is 60-80 min, a temperature of the second sintering process is at 400-350° C.

Compared with the prior art, a time interval between the first sintering process and the second sintering process can be reduced, and no more nitrogen is wasted in transition from the first sintering process to the second sintering process. The sintering apparatus of the present application is applicable to a sintering process of a display device.

Optionally, the first sintering chamber 10 is further provided with a blower device 102.

That is to say, the first sintering chamber 10 is communicated with external air through the first ventilation pipe 101, during the second chamber door 202 is opened and closed, some nitrogen in the second sintering chamber 20 is inevitably brought into the first sintering chamber 10, the blower device 102 of the first sintering chamber 10 can discharge the brought nitrogen out of the first sintering chamber 10 as soon as possible, so that the air within the first sintering chamber 10 has a desired purity.

Optionally, a third ventilation pipe 203 for introducing the second gas is provided at a position of the second sintering chamber 20 close to the second chamber door 202, as shown in FIG. 3.

That is to say, during the second chamber door 202 is opened and closed, some air in the first sintering chamber 10 is also inevitably brought into the second sintering chamber 20, in this case, by introducing the second gas into the second sintering chamber 20 at a position of the second sintering chamber 20 close to the second chamber door 202, the second gas within the second sintering chamber 20 may reach a desired purity as soon as possible.

Optionally, the second chamber door 202 comprises a hard sealed heat insulation plate.

That is to say, in a common sintering process, a temperature in the first sintering chamber 10 or the second sintering chamber 20 may be up to hundreds of degrees Celsius, forming the second chamber door 202 by the hard sealed heat insulation plate may prolong the service life of the second chamber door 202.

Optionally, the sintering apparatus further comprises a transporting device 3 for transporting the substrate 5.

That is to say, as shown in FIG. 3, in this embodiment, the sintering apparatus further comprises a transporting device 3 for transporting a clamp loaded with a plurality of substrates 5 between the first sintering chamber 10 and the second sintering chamber 20. Specifically, after completion of the first sintering process, the transporting device 3 transports the clamp into the second sintering chamber 20 from the first sintering chamber 10; and after completion of the second sintering process, the transporting device 3 transports the clamp into the first sintering chamber 10 from the second sintering chamber 20.

Optionally, the transporting device 3 is an elevating stage, and the second sintering chamber 20 is provided above the first sintering chamber 10, as shown in FIG. 3. During a sintering process, the clamp is first placed into the first sintering chamber 10 and on the elevating stage by using a mechanical hand, and a first sintering process is performed. After the first sintering process is completed, the clamp is transported into the second sintering chamber 20 from the first sintering chamber 10 by using the elevating stage. After the second sintering process is completed in the second sintering chamber 20, the clamp is transported into the first sintering chamber 10 from the second sintering chamber 20 by using the elevating stage, and then taken out from the first chamber door 103 by using the mechanical hand.

Figure 4:
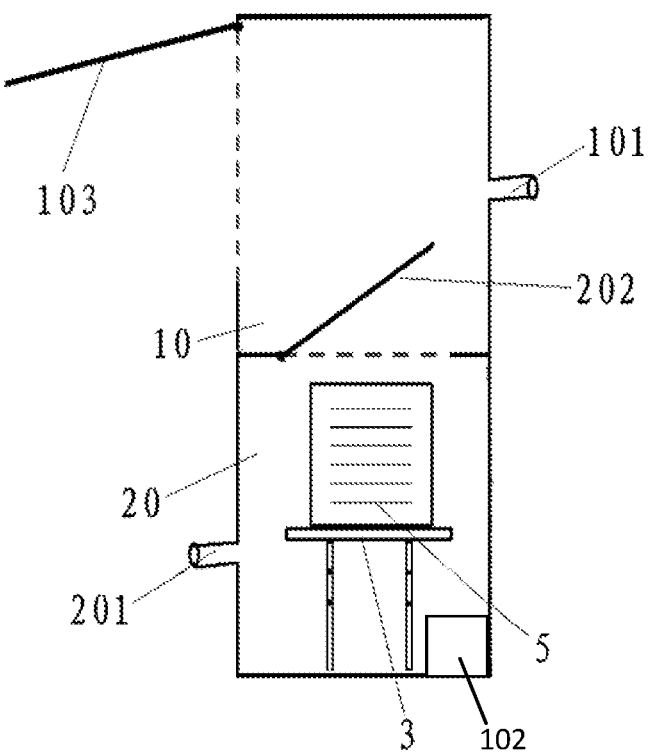
FIG. 4 is a structural diagram of a sintering apparatus in an embodiment of the present application.

Optionally, the transporting device 3 is an elevating stage, and the second sintering chamber 20 is provided below the first sintering chamber 10, as shown in FIG. 4. During a sintering process, the clamp is first placed into the first sintering chamber 10 and on the elevating stage by using a mechanical hand, and a first sintering process is performed. After the completion of the first sintering process, the clamp is transported into the second sintering chamber 20 from the first sintering chamber 10 by using the elevating stage. After the second sintering process is completed in the second sintering chamber 20, the clamp is transported into the first sintering chamber 10 from the second sintering chamber 20 by using the elevating stage, and then taken out from the first chamber door 103 by using the mechanical hand.

Figure 5:
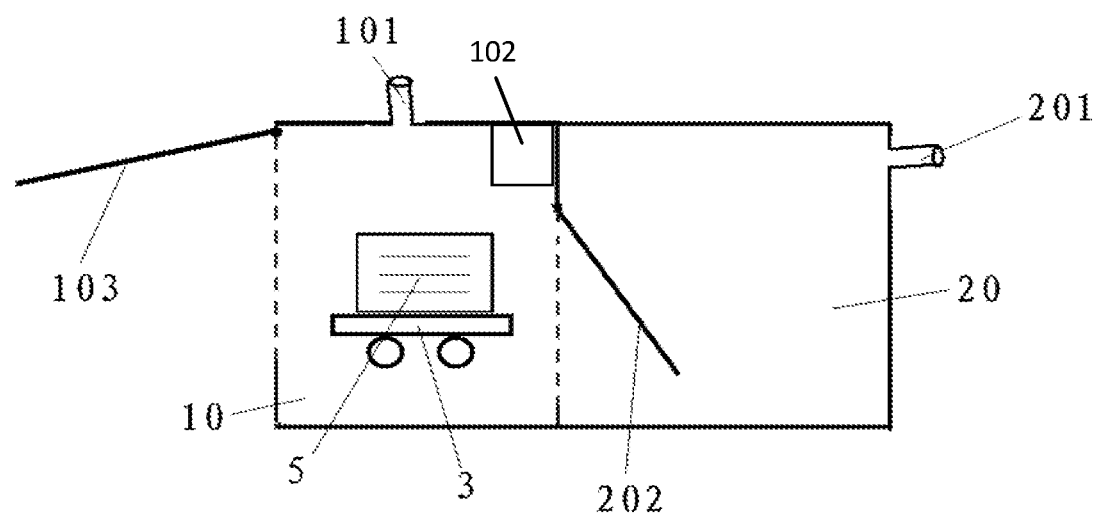
FIG. 5 is a structural diagram of a sintering apparatus in an embodiment of the present application.

Optionally, the transporting device 3 is a transmission slide rail, and the first sintering chamber 10 and the second sintering chamber 20 are provided side by side. As shown in FIG. 5, the first sintering chamber 10 and the second sintering chamber 20 are provided side by side, the clamp is transported between the first sintering chamber 10 and the second sintering chamber 20 by using the transmission slide rail.

Optionally, the sintering apparatus further comprises a transporting chamber 4, wherein a third chamber door 401 capable of being opened or closed is provided between the transporting chamber 4 and the first sintering chamber 10, and a fourth chamber door 402 capable of being opened or closed is provided between the transporting chamber 4 and the second sintering chamber 20.

Figure 6:
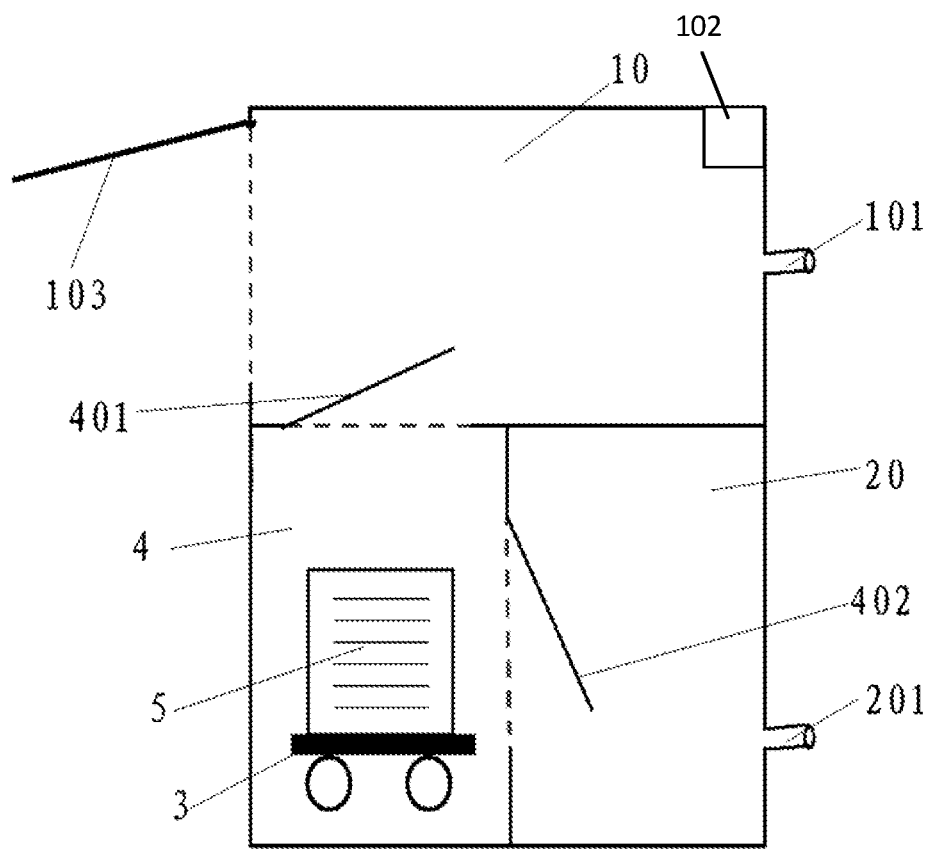
FIG. 6 is a structural diagram of a sintering apparatus in an embodiment of the present application.

That is to say, as shown in FIG. 6, the sintering apparatus comprises three chambers, that is, a first sintering chamber 10, a second sintering chamber 20 and a transporting chamber 4. The first sintering chamber 10 is communicated with air through a first ventilation pipe 101, nitrogen is introduced into the second sintering chamber 20 through a second ventilation pipe 201, and the transporting chamber 4 is a transition chamber. When the third chamber door 401 is opened and the substrate is transported by the transporting device 3 from the first sintering chamber 10 to the transporting chamber 4, some air may be brought into the transporting chamber 4, and when the fourth chamber door 402 is opened and the substrate is transported from the transporting chamber 4 to the second sintering chamber 20, nitrogen entering into the second sintering chamber 20 from the transporting chamber 4 is reduced extremely, vice versa. Thus, the transporting chamber 4 plays a buffer role, and due to the buffer of the transporting chamber 4, there is no significant change in purity of air in the first sintering chamber 10 or the second sintering chamber 20.

Position relationship among the first sintering chamber 10, the second sintering chamber 20 and the transporting chamber 4 shown in FIG. 6 is just illustrative, but not limited. Optionally, in an embodiment, the transporting chamber 4 may be provided between the first sintering chamber 10 and the second sintering chamber 20.

Third Embodiment

This embodiment provides a packaging system for an organic light emitting diode device, which comprises the above sintering apparatus.

Obviously, there are many variations in specific implementations of above embodiments, for example, the chamber door may be in a manner of double-door or a single-door, and specific positions and dimensions of the chamber doors may be changed as desired.

Fourth Embodiment

Figure 7:
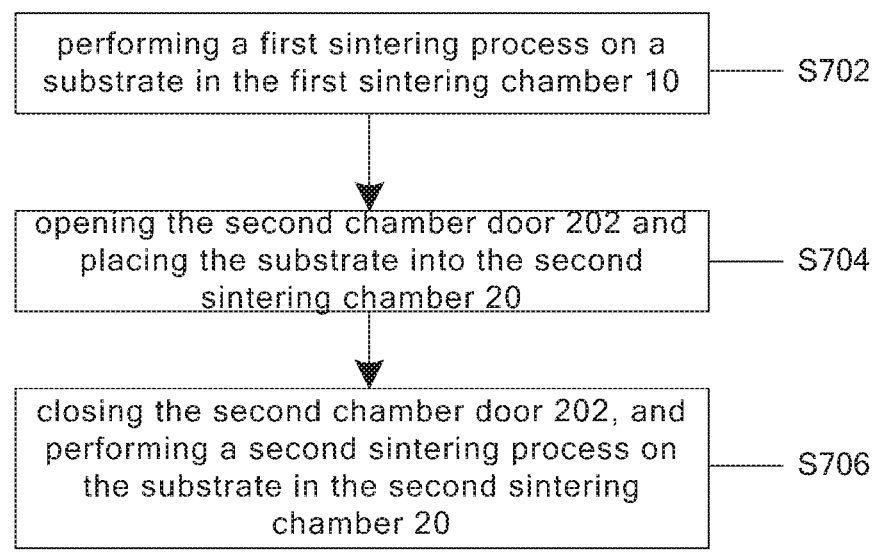
FIG. 7 is a flow chart diagram of a sintering method in an embodiment of the present application.

The present embodiment provides a sintering method implemented by using the sintering apparatus of the first embodiment or the second embodiment, as shown in FIG. 7, the sintering method of this embodiment comprises steps of:

S702, performing a first sintering process on a substrate in the first sintering chamber 10;

S704, opening the second chamber door 202 between the first sintering chamber 10 and the second sintering chamber 20, and placing the substrate into the second sintering chamber 20; and S706, closing the second chamber door 202, and performing a second sintering process on the substrate in the second sintering chamber 20.

Optionally, the sintering apparatus further comprises a transporting chamber 4, as shown in FIG. 6, and the sintering method of this embodiment further comprises steps of:

after the first sintering process is performed on the substrate in the first sintering chamber 10, opening a third chamber door 401 between the first sintering chamber 10 and the transporting chamber 4, and transporting the substrate into the transporting chamber 4; and closing the third chamber door 401 and opening a fourth chamber door 402 between the transporting chamber 4 and the second sintering chamber 20, and transporting the substrate into the second sintering chamber 20.

Optionally, the sintering apparatus further comprises a transporting chamber 4, as shown in FIG. 6, and the sintering method of this embodiment further comprises steps of:

after the second sintering process is performed on the substrate in the second sintering chamber 20, opening the fourth chamber door 402 between the second sintering chamber 20 and the transporting chamber 4, and transporting the substrate into the transporting chamber 4; and closing the fourth chamber door 402 and opening the third chamber door 401 between the transporting chamber 4 and the first sintering chamber 10, and transporting the substrate into the first sintering chamber 10.

Compared with the prior art, a time interval between the first sintering process and the second sintering process can be reduced, and no more second gas (nitrogen) is wasted in transition from the first sintering process to the second sintering process.

It should be understood that, the above embodiments are merely exemplary embodiments for describing the principle of the present application, but the present application is not limited thereto. Various modifications and improvements may be made by those skilled in the art without departing from the spirit and essence of the present application, and these modifications and improvements also fall into the protection scope of the present application.

The invention claimed is:

1. A sintering apparatus for sintering glass cement coated on a substrate, which comprises a first sintering chamber and a second sintering chamber disposed adjacent to each other, wherein the first sintering chamber is provided with a first chamber door capable of being opened or closed, and a first ventilation pipe communicating with external air, the substrate is placed into the first sintering chamber or taken out from the first chamber door through the first chamber door;

the second sintering chamber is provided with a second ventilation pipe for introducing a second gas into the second sintering chamber; and the first sintering chamber and the second sintering chamber are capable of being communicated with each other;

wherein the sintering apparatus further comprises a transporting device for transporting the substrate between the first sintering chamber and the second sintering chamber, the transporting device is an elevating stage, and the second sintering chamber is provided above the first sintering chamber.

2. The sintering apparatus of claim 1, wherein the first sintering chamber is further provided with a blower device.

3. The sintering apparatus of claim 1, wherein a second chamber door capable of being opened or closed is provided between the first sintering chamber and the second sintering chamber.

4. The sintering apparatus of claim 3, wherein the second chamber door comprises a hard sealed heat insulation plate.

5. The sintering apparatus of claim 3, wherein a third ventilation pipe for introducing the second gas is provided at a position of the second sintering chamber close to the second chamber door.

6. The sintering apparatus of claim 1, wherein the second gas is an inert gas.

7. The sintering apparatus of claim 6, wherein the inert gas is nitrogen.

8. A packaging system for an organic light emitting diode device, which comprises the sintering apparatus of claim 1.

9. A sintering method implemented by using the sintering apparatus of claim 1, which comprises steps of:

placing the substrate into the first sintering chamber;

performing a first sintering process on the substrate in the first sintering chamber;

upon completion of the first sintering process, opening a second chamber door between the first sintering chamber and the second sintering chamber, and placing the substrate into the second sintering chamber; and closing the second chamber door, and performing a second sintering process on the substrate in the second sintering chamber.

10. A sintering apparatus for sintering glass cement coated on a substrate, which comprises a first sintering chamber and a second sintering chamber disposed adjacent to each other, wherein the first sintering chamber is provided with a first chamber door capable of being opened or closed, and a first ventilation pipe communicating with external air, the substrate is placed into the first sintering chamber or taken out from the first chamber door through the first chamber door;

the second sintering chamber is provided with a second ventilation pipe for introducing a second gas into the second sintering chamber;

the first sintering chamber and the second sintering chamber are capable of being communicated with each other; and the sintering apparatus further comprises a transporting chamber, wherein a third chamber door capable of being opened or closed is provided between the transporting chamber and the first sintering chamber, and a fourth chamber door capable of being opened or closed is provided between the transporting chamber and the second sintering chamber.

11. The sintering apparatus of claim 10, wherein the transporting device is a transmission slide rail, and the first sintering chamber and the second sintering chamber are provided side by side.

12. The sintering apparatus of claim 10, wherein the first sintering chamber is further provided with a blower device.

13. The sintering apparatus of claim 10, wherein a second chamber door capable of being opened or closed is provided between the first sintering chamber and the second sintering chamber.

14. The sintering apparatus of claim 13, wherein the second chamber door comprises a hard sealed heat insulation plate.

15. The sintering apparatus of claim 13, wherein a third ventilation pipe for introducing the second gas is provided at a position of the second sintering chamber close to the second chamber door.

16. The sintering apparatus of claim 10, wherein the second gas is an inert gas.

17. The sintering apparatus of claim 16, wherein the inert gas is nitrogen.

18. A sintering method implemented by using the sintering apparatus of claim 10, which comprises steps of:
  placing the substrate into the first sintering chamber;
  performing a first sintering process on the substrate in the first sintering chamber;
  upon completion of the first sintering process, opening a second chamber door between the first sintering chamber and the second sintering chamber, and placing the substrate into the second sintering chamber; and
  closing the second chamber door, and performing a second sintering process on the substrate in the second sintering chamber.

19. The sintering method of claim 18, wherein the sintering method further comprises steps of:
  after the first sintering process is performed on the substrate in the first sintering chamber, opening the third chamber door between the first sintering chamber and the transporting chamber, and transporting the substrate into the transporting chamber; and
  closing the third chamber door and opening the fourth chamber door between the transporting chamber and the second sintering chamber, and transporting the substrate into the second sintering chamber.

20. The sintering method of claim 18, wherein the sintering method further comprises steps of:
  after the second sintering process is performed on the substrate in the second sintering chamber, opening the fourth chamber door between the second sintering chamber and the transporting chamber, and transporting the substrate into the transporting chamber; and
  closing the fourth chamber door and opening the third chamber door between the transporting chamber and the first sintering chamber, and transporting the substrate into the first sintering chamber.

* * * * *